United States Patent
Liu et al.

(10) Patent No.: US 11,495,644 B2
(45) Date of Patent: Nov. 8, 2022

(54) DISPLAY APPARATUS, DISPLAY DEVICE AND CONTROL METHOD THEREOF, AND NON-TRANSIENT COMPUTER-READABLE STORAGE MEDIUM

(71) Applicants: Chengdu BOE Optoelectronics Technology Co., Ltd., Sichuan (CN); BOE Technology Group Co., Ltd., Beijing (CN)

(72) Inventors: Ke Liu, Beijing (CN); Ling Shi, Beijing (CN); Bingqiang Gui, Beijing (CN); Hao Zhang, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 17/183,382

(22) Filed: Feb. 24, 2021

(65) Prior Publication Data
US 2021/0305333 A1  Sep. 30, 2021

(30) Foreign Application Priority Data
Mar. 31, 2020 (CN) .......................... 202010247421.X

(51) Int. Cl.
H01L 27/32 (2006.01)
H01L 41/09 (2006.01)
H05K 1/18 (2006.01)

(52) U.S. Cl.
CPC ...... H01L 27/3225 (2013.01); H01L 27/3276 (2013.01); H01L 41/09 (2013.01); H05K 1/189 (2013.01); H05K 2201/10128 (2013.01)

(58) Field of Classification Search
CPC . H01L 27/3225; H01L 27/3276; H01L 41/09; H05K 1/189
See application file for complete search history.

(56) References Cited

U.S. PATENT DOCUMENTS 4,395,910 A * 8/1983 Thomenius ........ G01N 29/0627
73/620
5,749,833 A * 5/1998 Hakki .................... A61B 5/339
600/380

(Continued)

FOREIGN PATENT DOCUMENTS

| CN | 107967443 A | 4/2018 |
| CN | 109492460 A | 3/2019 |
| CN | 110008939 A | 7/2019 |

OTHER PUBLICATIONS

Office Action dated May 6, 2022 for Chinese Patent Application No. 202010247421.X and English Translation.

Primary Examiner — Fred Tzeng
(74) Attorney, Agent, or Firm — Ling Wu; Stephen Yang; Ling and Yang Intellectual Property

(57) ABSTRACT

A display apparatus, display device and control method thereof, and non-transient computer-readable storage medium are provided. The display apparatus includes a display substrate and an ultrasonic transducer. The ultrasonic transducer includes a receiving electrode layer, which is disposed between two opposite bottom surfaces of the display substrate, and other parts of the ultrasonic transducer are disposed outside the display substrate. The display substrate includes a first pixel circuit and a first light emitting device, and the first light emitting device and the receiving electrode layer are respectively connected with the corresponding output terminals of the first pixel circuit.

19 Claims, 4 Drawing Sheets

(56) References Cited

U.S. PATENT DOCUMENTS

| | | | | |
|---|---|---|---|---|
| 5,829,439 A | * | 11/1998 | Yokosawa | A61B 8/12 |
| | | | | 600/461 |
| 5,840,030 A | * | 11/1998 | Ferek-Petric | A61B 18/1492 |
| | | | | 607/122 |
| 11,269,461 B2 | * | 3/2022 | Ding | B06B 1/0688 |
| 2012/0194038 A1 | * | 8/2012 | Wang | H01L 41/29 |
| | | | | 204/192.1 |
| 2014/0198072 A1 | * | 7/2014 | Schuele | G06F 3/0412 |
| | | | | 345/174 |
| 2017/0173262 A1 | * | 6/2017 | Veltz | G16H 20/17 |
| 2019/0133558 A1 | * | 5/2019 | Morimoto | A61B 8/4466 |
| 2021/0232789 A1 | | 7/2021 | Ding et al. | |

\* cited by examiner

Control the first scan signal terminal and the second scan signal terminal to output a first scan level, so that the first switching device, the third switching device and the fifth switching device are turned on. Control the first voltage terminal to output a first level, so that the sixth switching device is turned on. Control data signal terminal to output the reference level, so that the control electrode of the second switching device is restored to the reference level, the input terminal of the first light emitting device is reset, and the level of the second node becomes the first level; the ultrasonic transducer transmits ultrasonic waves — S401

Control the first voltage terminal to output a second level to turn off the sixth switching device; the second switching device is turned off when the level of the signal of the third node rises to a first preset level; when the control electrode of the fourth switching device receives the echo signal output by the ultrasonic transducer through the second node B, the second electrode of the fourth switching device inputs an amplified signal corresponding to the echo signal, and the amplified signal is sent to a designated part through the fifth switching device — S402

Control the second scanning signal terminal to output the second scan level, so that the first switching device is turned off; control the data signal terminal to output data level so that the signal level of the third node becomes a second preset level — S403

Control the first scanning signal terminal to output a second scanning level and control the second scanning signal terminal to output a first scanning level, so that the third switching device is turned off and the first switching device is turned on to drive the first light emitting device in the display device to emit light — S404

FIG. 5

DISPLAY APPARATUS, DISPLAY DEVICE AND CONTROL METHOD THEREOF, AND NON-TRANSIENT COMPUTER-READABLE STORAGE MEDIUM

CROSS-REFERENCE TO RELATED APPLICATION

The present application claims the priority of Chinese Patent Application No. 202010247421.X, filed to the CNIPA on Mar. 31, 2020, the content of which is hereby incorporated by reference.

TECHNICAL FIELD

The embodiments of present disclosure relate to, but are not limited to, the technical field of display, in particular to a display apparatus, a display device and a control method thereof, and a non-transient computer readable storage medium.

BACKGROUND

Ultrasonic transducers have been widely used in display devices and can achieve biometric identification (such as fingerprint identification). In the display device, the ultrasonic transducer can be attached to the display substrate in the form of a plug-in module. At this time, the ultrasonic transducer is provided with an independent driver circuit, which is configured to drive the ultrasonic transducer to transmit and receive ultrasonic waves.

SUMMARY

The following is a summary of the subject matters described in detail in the present disclosure. This summary is not intended to limit the protection scope of the claims.

In a first aspect, the present disclosure provides a display apparatus including a display substrate and an ultrasonic transducer. The ultrasonic transducer includes a receiving electrode layer, which is disposed between two opposite bottom surfaces of the display substrate, and other parts of the ultrasonic transducer are disposed outside the display substrate.

The display substrate is provided with a first pixel circuit and a first light emitting device, and the first light emitting device and the receiving electrode layer are respectively connected with the corresponding output terminals of the first pixel circuit.

In some possible implementations, the two opposite bottom surfaces of the display substrate include a shady surface and a light exiting surface; the receiving electrode layer is close to the shady surface, and other parts of the ultrasonic transducer are attached to the side, away from the light exiting surface, of the shady surface.

In some possible implementations, other parts of the ultrasonic transducer include a piezoelectric material layer and a transmitting electrode layer; the piezoelectric material layer is attached to one side, away from the light exiting surface, of the shady surface, and the transmitting electrode layer is attached to one side, away from the shady surface, of the piezoelectric material layer.

In some possible implementations, the first pixel circuit includes an energy storage subcircuit and first to sixth switching devices; a first electrode, a second electrode and a control electrode of the first switching device are electrically connected to the first voltage terminal, and the first electrode of the second switching device and the second scan signal terminal, respectively; a control electrode and a second electrode of the second switching device are electrically connected to the first node and the third node, respectively; a first electrode, a second electrode and a control electrode of the third switching device are electrically connected to the data signal terminal, the first node and the first scan signal terminal, respectively; a first electrode, a second electrode and a control electrode of the fourth switching device are electrically connected to the first voltage terminal, and the first electrode of the fifth switching device and the second node, respectively; a control electrode and a second electrode of the fifth switching device are electrically connected to the first scan signal terminal and the echo signal output terminal, respectively; a first electrode and a control electrode of the sixth switching device are both electrically connected to the first voltage terminal, and the second electrode of the sixth switching device is electrically connected to the second node; a first terminal, a second terminal and a common terminal of the energy storage subcircuit are electrically connected to the first node, the second voltage terminal and the third node, respectively.

In some possible implementations, the second node is electrically connected to the receiving electrode layer of the ultrasonic transducer.

In some possible implementations, the first electrode and the second electrode of the first light emitting device are electrically connected to the third node and the second voltage terminal, respectively.

In some possible implementations, the first to fifth switching devices are N-type field-effect transistors (FETs), in the first to fifth switching devices the control electrode, the first electrode and the second electrode of each switching device are the gate electrode, the source electrode and the drain electrode of the N-type FETs, respectively; the second switching device is a driving transistor.

In some possible implementations, the sixth switching device is a P-type FET, and the control electrode, the first electrode and the second electrode of the sixth switching device are the gate electrode, the source electrode and the drain electrode of the P-type FET, respectively.

In some possible implementations, the first to fifth switching devices are P-type FETs, and in the first to fifth switching devices, the control electrode, the first electrode and the second electrode of each switching device are the gate electrode, the source electrode and the drain electrode of the P-type FETs, respectively; the second switching device is a driving transistor.

In some possible implementations, the sixth switching device is a N-type FET, and the control electrode, the first electrode and the second electrode of the sixth switching device are the gate electrode, the source electrode and the drain electrode of the N-type FET, respectively.

In some possible implementations, the energy storage subcircuit includes at least two capacitors connected in series; the first terminal of the first capacitor and the second terminal of the last capacitor are respectively used as the first terminal and the second terminal of the energy storage subcircuit; a tandem node of the two specified capacitors is used as the common terminal of the energy storage subcircuit.

In some possible implementations, the energy storage subcircuit includes: a first capacitor and a second capacitor; a first terminal and a second terminal of the first capacitor are electrically connected to the first node and the third node respectively; a first terminal and a second terminal of the second capacitor are electrically connected to the third node and the second voltage terminal respectively.

The first terminal of the first capacitor serves as the first terminal of the energy storage subcircuit, the second terminal of the second capacitor serves as the second terminal of the energy storage sub circuit, and the third node serves as the common terminal of the energy storage subcircuit.

In a second aspect, the present disclosure further provides a display device, including the above display apparatus.

In some possible implementations, it further includes a processor; the processor is electrically connected to a first pixel circuit in the display apparatus and is configured to control the first pixel circuit to drive a first light emitting device in the display apparatus to emit light, or receive an echo signal of an ultrasonic transducer in the display apparatus.

In some possible implementations, it also includes flexible printed circuit board; the first terminal of the flexible printed circuit board is electrically connected to the display substrate, and the second terminal is bent to the non-display side of the display substrate; the processor is disposed at the second terminal of the flexible printed circuit board and located on the side, away from the display substrate, of the second terminal of the flexible printed circuit board, and is electrically connected to the first pixel circuit through the flexible printed circuit board.

In a third aspect, the present disclosure further provides a control method for a display device, applied to the above-mentioned display device, including: controlling the first pixel circuit to drive a first light emitting device in the display apparatus to emit light, or receive an echo signal of an ultrasonic transducer in the display apparatus.

In some possible implementations, controlling the first pixel circuit to drive a first light emitting device in the display apparatus to emit light, or receive an echo signal of an ultrasonic transducer in the display apparatus includes:

controlling the first scan signal terminal and the second scan signal terminal to output a first scanning level, so that the first switching device, the third switching device and the fifth switching device are turned on; controlling the first voltage terminal to output a first level so that the sixth switching device is turned on; controlling the data signal terminal to output a reference level, so that the control electrode of the second switching device is restored to the reference level, the input terminal of the first light emitting device is reset, and the level of the second node becomes the first level; the ultrasonic transducer emits ultrasonic waves;

controlling the first voltage terminal to output a second level to turn off the sixth switching device; when the level of the signal of the third node rises to a first preset level, the second switching device is turned off; when the control electrode of the fourth switching device receives the echo signal output by the ultrasonic transducer through the second node, the second electrode of the fourth switching device inputs an amplified signal corresponding to the echo signal, and the amplified signal is sent to a designated part through the fifth switching device;

controlling the second scan signal terminal to output a second scanning level to turn off the first switching device; controlling the data signal terminal to output data level so that the level of the third node becomes a second preset level;

controlling the first scan signal terminal to output a second scanning level and controlling the second scan signal terminal to output a first scanning level, so that the third switching device is turned off and the first switching device is turned on to drive the first light emitting device in the display apparatus to emit light.

In some possible implementations, the first preset level is the difference between the reference level and the threshold voltage of the second switching device.

In some possible implementations, the first pixel circuit includes: first to sixth switching devices, a first capacitor and a second capacitor, and the second preset level V meets $V = V\text{ref} - V\text{th} + (V\text{data} - V\text{ref})C2/(C1+C2)$ Wherein, Vref is the reference level, Vdata is the data level, Vth is the threshold voltage of the second switching device, C1 is the capacitance value of the first capacitor, and C2 is the capacitance value of the second capacitor.

In a fourth aspect, the present disclosure also provides a non-transient computer readable storage medium, in which computer-executable instructions are stored, and the computer-executable instructions are configured to achieve the control method of the above display device.

Other aspects will become apparent upon reading and understanding accompanying drawings and the detailed description.

BRIEF DESCRIPTION OF DRAWINGS

Accompanying drawings are used to provide an understanding of technical solutions of the present disclosure and form a part of the specification. Together with embodiments of the present disclosure, they are used to explain technical solutions of the present disclosure and do not constitute a limitation on the technical solutions of the present disclosure.

FIG. 5 is a schematic flowchart of a control method of a display device according to an embodiment of the present disclosure;

DETAILED DESCRIPTION

Figure 1:
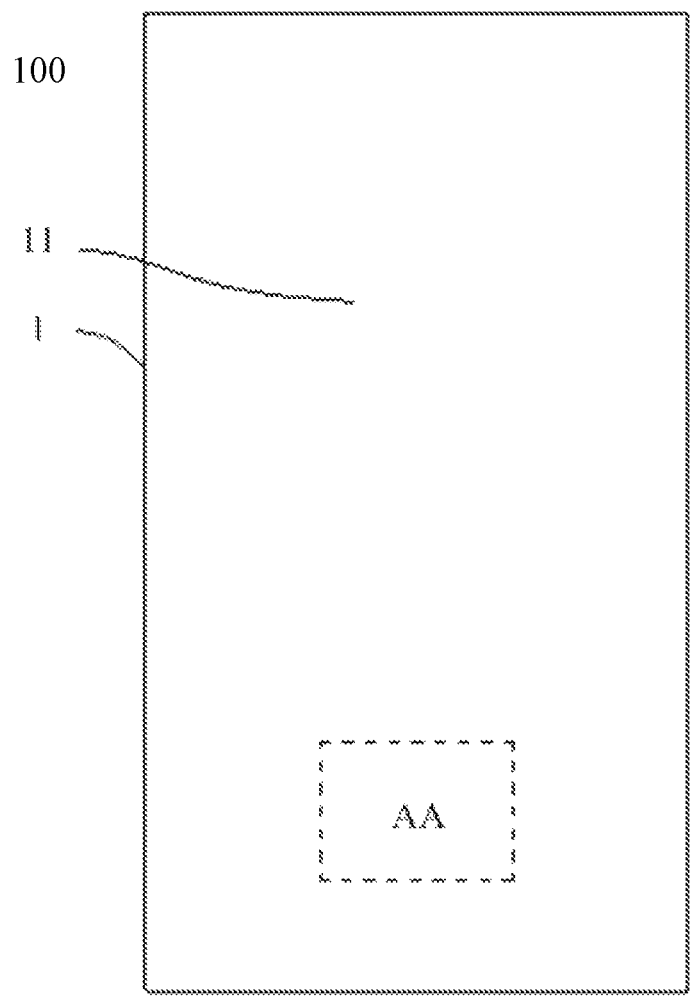
FIG. 1 is a front view diagram of a display device according to an embodiment of the present disclosure.

Hereinafter, embodiments of the present disclosure will be described in detail with reference to the accompanying drawings. Without conflict, embodiments in the present disclosure and features in the embodiments may be combined with each other arbitrarily.

The present disclosure is described in detail below. Examples of the embodiments are illustrated in the drawings, wherein same or similar reference numbers refer to same or similar components or components having same or similar functions throughout the drawings.

It will be understood by those skilled in the art that unless otherwise defined, all terms (including technical terms and scientific terms) used herein have the same meanings as those generally understood by those skilled in the art to which the present disclosure pertains.

It will be understood by those skilled in the art, the singular forms "a", "an", "said" and "the" used herein may also include plural forms unless expressly stated. It may be understood that the phase "including" used in the specification of the present disclosure means the presence of stated features, integers, acts, operations, elements or components, but does not exclude the presence or addition of one or more other features, integers, acts, operations, elements, components or combinations thereof. It may be understood that when stating that an element is "connected" or "coupled" to another element, such element may be directly connected or coupled to other elements, or there may be intermediate elements. In addition, "connected" or "coupled" used herein may include wireless connection or wireless coupling.

The following is a brief explanation of English abbreviations appeared in the specification and drawings:

OLED: organic light-emitting diode, also known as organic electroluminescent display and organic light emitting semiconductor.

FPC: flexible printed circuit board.

In a display device, the arrangement of the ultrasonic transducer in the display device equips the ultrasonic transducer with an independent driver circuit, which increases the thickness of the display device.

Figure 2:
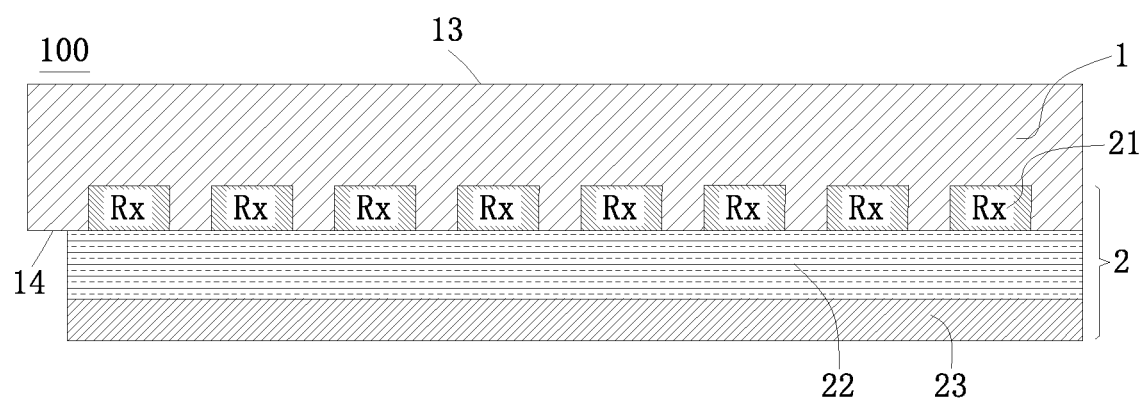
FIG. 2 is a schematic diagram of a film layer of a first region of a display device according to an exemplary embodiment.
Figure 3:
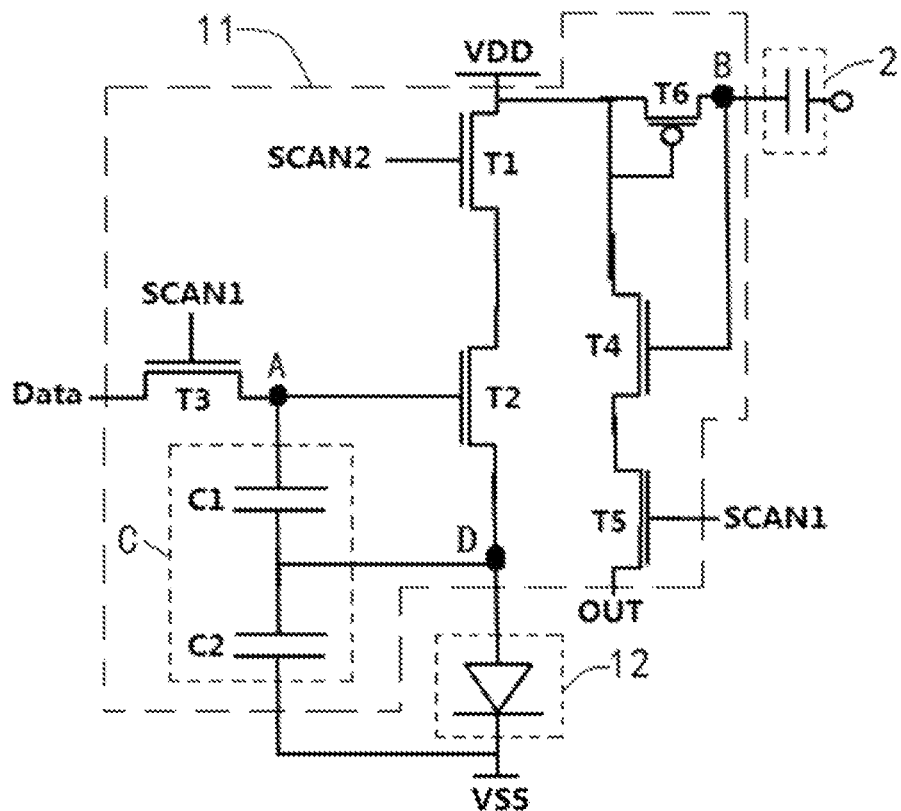
FIG. 3 is a schematic diagram of structure of a pixel circuit according to an exemplary embodiment.

FIG. 1 is a front view diagram of a display device according to an embodiment of the present disclosure; FIG. 2 is a schematic diagram of a film layer of a first region of a display device according to an exemplary embodiment; FIG. 3 is a schematic diagram of structure of a pixel circuit according to an exemplary embodiment. As shown in FIGS. 1 to 3, an embodiment of the present disclosure provides a display device 100 including a display substrate 1 and an ultrasonic transducer 2.

As shown in FIG. 2, the ultrasonic transducer 2 includes a receiving electrode layer 21 disposed between two opposite bottom surfaces of the display substrate 1, that is, the display substrate 1 includes the receiving electrode layer 21 inside. Other parts of the ultrasonic transducer 2 may be disposed outside the display substrate 1.

As shown in FIGS. 2 and 3, the display substrate 1 includes a first pixel circuit 11 and a first light emitting device 12. The first light emitting device 12 and the receiving electrode layer 21 are electrically connected to corresponding output terminals in the first pixel circuit 11, respectively.

In an exemplary embodiment, the output terminal of the first pixel circuit 11 may include: a driving voltage output terminal and an echo signal receiving terminal. The input terminal of the first light emitting device 12 may be electrically connected to the driving voltage output terminal of the first pixel circuit 11. The receiving electrode layer 21 of the ultrasonic transducer 2 may be electrically connected to the echo signal receiving terminal in the first pixel circuit 11.

In an exemplary embodiment, the display substrate 1 may be an OLED panel. The display substrate 1 may include a driver circuit layer and multiple organic light emitting diodes arranged in an array, and the driver circuit layer of the display substrate 1 may include multiple pixel circuits. The first pixel circuit 11 may be one of the pixel circuits in the driver circuit layer. The first light emitting device 12 may be one of the organic light emitting diodes.

In an exemplary embodiment, a receiving electrode layer 21 may be included inside the display substrate 1, and the receiving electrode layer 21 may be located in the first region of the display substrate 1, and the first pixel circuit 11 and the first light emitting device 12 may also be located in the first region of the display substrate 1. As shown in FIG. 1, the first region may be the dashed box where the label AA is located.

In an exemplary embodiment, the shape of the first region and its position and shape on the display substrate 1 may be determined according to actual design requirements.

In an exemplary embodiment, the role of the ultrasonic transducer 2 in the display apparatus can be determined according to the actual design requirements. For example, the ultrasonic transducer 2 may be used as an ultrasonic fingerprint recognizer, and the dashed box where AA is located may be used as a fingerprint recognition region.

Since the receiving electrode layer 21 of the ultrasonic transducer 2 is disposed in the display substrate 1, the thickness of the display substrate 1 and the ultrasonic transducer 2 as a whole is reduced the thickness of one receiving electrode layer 21. The display substrate 1 provided in this embodiment can be used in a display device to reduce the thickness of the display device.

In an exemplary embodiment, the first pixel circuit 11 may be configured to control the light emitting state of the first light emitting device 12 in the first region, and may be configured to receive the echo signal of the ultrasonic transducer 2 in the display device 100. The first light emitting device 12 and the ultrasonic transducer 2 share the first pixel circuit 11, which reduces the circuit complexity of the display device and lowers the power consumption of the circuit.

In an exemplary embodiment, as shown in FIG. 2, two opposite bottom surfaces of the display substrate 1 include a shady surface 14 and a light exiting surface 13. The receiving electrode layer 21 is close to the shady surface 14.

In an exemplary embodiment, other parts of the ultrasonic transducer 2 may be attached to the side, away from the light exiting surface 13, of the shady surface 14.

In an exemplary embodiment, as shown in FIG. 2, the receiving electrode layer 21 may include multiple receiving electrodes Rx. Among them, multiple receiving electrodes Rx may be disposed at intervals along the direction parallel to the shady surface 14. The receiving electrode Rx may be integrated in the driver circuit layer of the display substrate 1.

In an exemplary embodiment, as shown in FIG. 2, other parts of the ultrasonic transducer 2 may include a piezoelectric material layer 22 and a transmitting electrode layer 23.

In an exemplary embodiment, the piezoelectric material layer 22 may be attached to a side, away from the light exiting surface 13, of the shady surface 14. The emitting electrode layer 23 may be attached to one side, away from the shady surface 14, of the piezoelectric material layer 22.

In an exemplary embodiment, the piezoelectric material layer 22 and the transmitting electrode layer 23 may face the first region of the display substrate 1, that is, the transmitting electrode layer 23, the piezoelectric material layer 22 and the receiving electrode layer 21 are sequentially stacked.

In an exemplary embodiment, as shown in FIG. 3, the first pixel circuit 11 may include an energy storage subcircuit C, a first switching device T1, a second switching device T2, a third switching device T3, a fourth switching device T4, a fifth switching device T5 and a sixth switching device T6. Each switching device has a control electrode, a first electrode and a second electrode.

In this specification, the first electrode, the second electrode, and the control electrode of the switching device are respectively electrically connected to the first terminal, the second terminal, and the third terminal, which means that the first electrode of the switching device is electrically connected to the first terminal, the second electrode of the switching device is electrically connected to the second terminal, and the control electrode of the switching device is electrically connected to the third terminal.

In an exemplary embodiment, the first to fifth switching devices may be N-type field-effect transistors (FETs). In the first to fifth switching devices (T1-T5), the control electrode, the first electrode and the second electrode of each switching device are the gate electrode, the source electrode and the drain electrode of the N-type FETs, respectively. The sixth switching device T6 may be a P-type FET, and the control electrode, the first electrode and the second electrode of the sixth switching T6 device are the gate electrode, the source electrode and the drain electrode of the P-type FET, respectively.

In an exemplary embodiment, the first to fifth switching devices may be P-type FETs, and in the first to fifth switching devices (T1-T5), the control electrode, the first electrode and the second electrode of each switching device are the gate electrode, the source electrode and the drain electrode of the P-type FETs, respectively. The sixth switching device T6 may be a N-type FET, and the control electrode, the first electrode and the second electrode of the sixth switching T6 device are the gate electrode, the source electrode and the drain electrode of the N-type FET, respectively.

In an exemplary embodiment, the source electrode and drain electrode of each FET may be interchangeable.

In an exemplary embodiment, each switching device may adopt other types of switching tubes, such as triodes.

In an exemplary embodiment, as shown in FIG. 3, a first electrode, a second electrode and a control electrode of the first switching device T1 are electrically connected to the first voltage terminal VDD, the first electrode of the second switching device T2 and the second scan signal terminal SCAN2, respectively;

In an exemplary embodiment, as shown in FIG. 3, a control electrode and a second electrode of the second switching device T2 are electrically connected to the first node A and the third node D, respectively.

In an exemplary embodiment, the second switching device T2 may be a driving transistor.

In an exemplary embodiment, as shown in FIG. 3, a first electrode, a second electrode and a control electrode of the third switching device T3 are electrically connected to the data signal terminal (Data), the first node A and the first scan signal terminal SCAN1, respectively.

In an exemplary embodiment, as shown in FIG. 3, a first electrode, a second electrode and a control electrode of the fourth switching device T4 are electrically connected to the first voltage terminal VDD, the first terminal of the fifth switching device T5 and the second node B, respectively.

In an exemplary embodiment, as shown in FIG. 3, a control electrode and a second electrode of the fifth switching device T5 are electrically connected to the first scan signal terminal SCAN1 and the echo signal output terminal OUT, respectively.

In an exemplary embodiment, as shown in FIG. 3, the first electrode and the control electrode of the sixth switching device T6 are both electrically connected to the first voltage terminal VDD, and the second electrode of the sixth switching device T6 is electrically connected to the second node B.

In an exemplary embodiment, as shown in FIG. 3, the first terminal, the second terminal and the common terminal of the energy storage subcircuit C are electrically connected to the first node A, the second voltage terminal VSS and the third node D, respectively.

As shown in FIG. 3, in an exemplary embodiment, the second electrode of the fifth switching device T5 serves as an echo signal output terminal in the first pixel circuit 11 for outputting an amplified signal corresponding to the echo signal. As shown in FIG. 3, the second terminal of the fifth switching device T5 is an OUT terminal, and the designated component is connected with the OUT terminal and is used for receiving the amplified signal corresponding to the echo signal.

As shown in FIG. 3, in an exemplary embodiment, the third node D is the driving voltage output terminal in the first pixel circuit 11, and the second node B is the echo signal receiving terminal in the first pixel circuit 11.

As shown in FIG. 3, in an exemplary embodiment, the second node B may be electrically connected to the receiving electrode layer 21 of the ultrasonic transducer 2.

As shown in FIG. 3, in an exemplary embodiment, the third node D may be electrically connected to the first electrode of the first light emitting device 12. A second electrode of the first light emitting device 12 is electrically connected to a second voltage terminal VSS.

In an exemplary embodiment, the signal level of the second voltage terminal VSS may continue to be a low level signal.

In an exemplary embodiment, the energy storage subcircuit C may include at least two capacitors connected in series. The first terminal of the first capacitor and the second terminal of the last capacitor are respectively used as the first terminal and the second terminal of the energy storage subcircuit C. A tandem node of the two specified capacitors is used as the common terminal of the energy storage subcircuit C.

As shown in FIG. 3, in an exemplary embodiment, the energy storage subcircuit C may include a first capacitor C1 and second capacitor C2 connected in series, with the first terminal of the first capacitor C1 and the second terminal of the second capacitor C2 serving as the first and second terminals of the energy storage subcircuit C, respectively. The second terminal of the first capacitor C1 and the first terminal of the second capacitor C2 are connected in series, and the tandem node of the first capacitor C1 and the second capacitor C2 is used as the common terminal of the energy storage subcircuit C.

In an exemplary embodiment, the energy storage subcircuit C may include more than three capacitors connected in series. Taking the energy storage subcircuit C as an example, it may include three capacitors connected in series in sequence. The first terminal of the first capacitor and the second terminal of the last capacitor are respectively used as the first terminal and the second terminal of the energy storage subcircuit C. The tandem node of the first capacitor and the second capacitor is used as the common terminal of the energy storage subcircuit C, or the tandem node of the second capacitor and the third capacitor is used as the common terminal of the energy storage subcircuit C.

Figure 4:
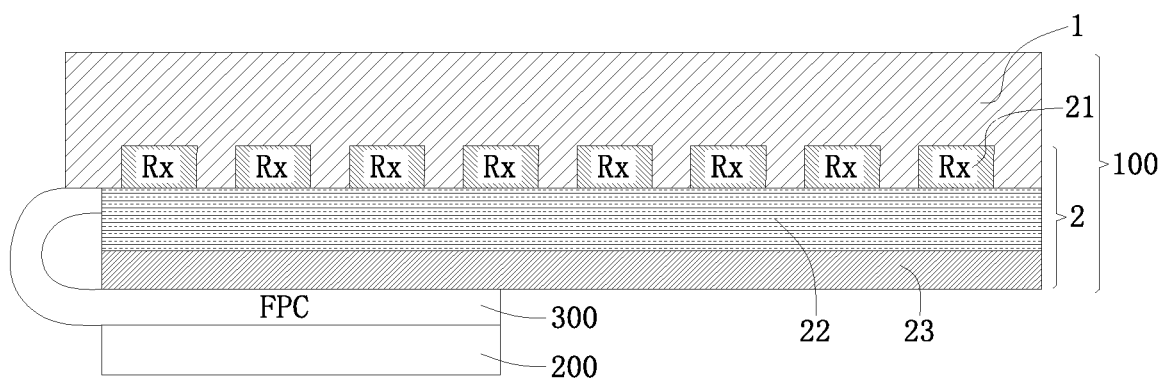
FIG. 4 is a schematic diagram of a film layer of a partial region of a display device according to an embodiment of the present disclosure.

FIG. 4 is a schematic diagram of a film layer of a partial region of a display device according to an embodiment of the present disclosure. As shown in FIG. 4, an embodiment of the present disclosure also provides a display device, which may include a display apparatus 100.

In an exemplary embodiment, the display apparatus may be a mobile phone, a tablet computer, a television, a display, a notebook computer, a digital photo frame, or a navigator.

The display apparatus is the display apparatus according to any one of the previous embodiments, and they are similar in the implementation principle and effect, which will not be further described here.

As shown in FIG. 4, a display device according to an exemplary embodiment may further include a processor 200. The processor 200 may be electrically connected to the first pixel circuit 11 in the display device, and is configured to control the first pixel circuit to drive the first light emitting device in the display device to emit light or receive the echo signal of the ultrasonic transducer in the display device.

In an exemplary embodiment, the processor 200 may be electrically connected to the signal input terminals in the first pixel circuit 11 in the display device. The signal input terminals include: a first voltage terminal, a second voltage terminal, a data signal terminal, a first scan signal terminal and a second scan signal terminal.

In an exemplary embodiment, the processor 200 may be a central processing unit (CPU), a general processor, a digital signal processor (DSP), an application specific integrated circuit (ASIC), a field-programmable gate array (FPGA) or other programmable logic devices, transistor logic devices, hardware components or any combination thereof, which may implement or execute the various exemplary logical blocks, modules and circuits described in connection with the present disclosure.

In an exemplary embodiment, the processor 200 may be a combination for implementing computing functions, such as including one or more microprocessors combinations, or DSP and microprocessor combinations.

In an exemplary embodiment, the display device may further include a flexible printed circuit board 300. The first terminal of the flexible printed circuit board 300 is electrically connected to the display substrate 1, and the second terminal is bent to the non-display side of the display substrate 1.

In an exemplary embodiment, as shown in FIGS. 2 and 4, the non-display side of the display substrate 1 may be the shady surface 14. The second terminal of the flexible printed circuit board 300 may be bent to the shady surface 14 of the display substrate 1.

In an exemplary embodiment, the processor 200 may be disposed at the second terminal of the flexible printed circuit board 300 and located on the side, away from the display substrate 1, of the second terminal of the flexible printed circuit board 300. The processor 200 may be electrically connected to the signal input terminal of the first pixel circuit 11 through the flexible printed circuit board 300.

The display device provided by the embodiment of the present disclosure has the same inventive concept and the same beneficial effects as the previous embodiments, and the contents not shown in detail in the display device may be referred to the previous embodiments, and will not be further described in detail here.

The embodiment of the present disclosure also provides a control method applied to the above-mentioned display device according to the above embodiments. The control method of the display device includes: controlling the first pixel circuit to drive a first light emitting device in the display device to emit light, or receive an echo signal of an ultrasonic transducer in the display device. For example, adjusting the on-off state of the first pixel circuit 11 to drive the display state of the first light emitting device 12 of the display device 100, or receive the echo signal of the ultrasonic transducer 2 of the display device 100.

Figure 6:
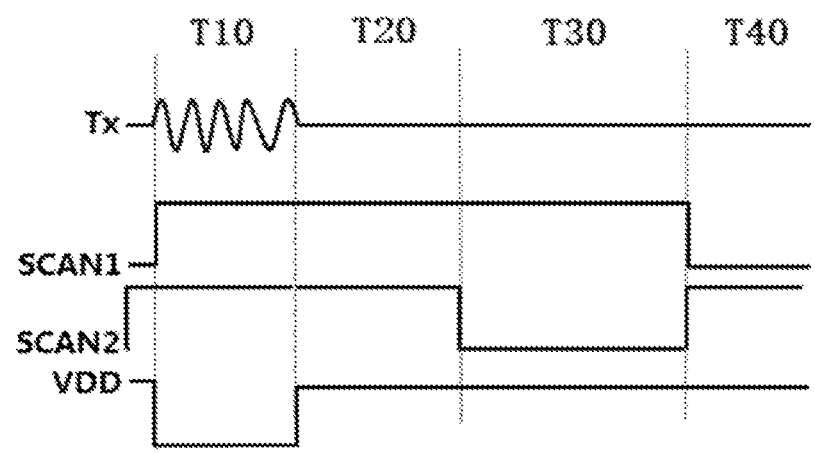
FIG. 6 is a sequence chart of a signal terminal and a voltage terminal connected with a first pixel circuit and an ultrasonic transmitting terminal of an ultrasonic transducer according to an exemplary embodiment.

FIG. 6 is a sequence chart of a signal terminal, connected with a first pixel circuit, a voltage terminal and an ultrasonic transmitting terminal of an ultrasonic transducer 2 according to an exemplary embodiment. In FIG. 6, the wavy line corresponding to Tx indicates the change of the ultrasonic signal emitted by the ultrasonic transmitting terminal of the ultrasonic transducer 2. The wavy line corresponding to SCAN1 indicates the change of the level output by the first scan signal terminal SCAN1. The wavy line corresponding to SCAN2 indicates the change of the level output by the second scan signal terminal SCAN2. The wavy line corresponding to VDD indicates the change of the level output by the first voltage terminal VDD.

In an exemplary embodiment, the first scan signal terminal SCAN1 may output a first scan level and a second scan level.

In an exemplary embodiment, the second scan signal terminal SCAN2 may output a first scan level and a second scan level.

In an exemplary embodiment, the first scan level may be higher than the second scan level.

In an exemplary embodiment, the first voltage terminal VDD may output a first level and a second level.

In an exemplary embodiment, the first level may be lower than the second level.

As shown in FIG. 6, the workflow of the control method of the display device according to an exemplary embodiment may include four stages, which are the first stage T10, the second stage T20, the third stage T30 and the fourth stage T40 in turn.

The ultrasonic signals are transmitted by the ultrasonic transmitting terminal of the ultrasonic transducer 2 in the first stage T10. The first scan signal terminal SCAN1 outputs a first scan level in the first stage T10, the second stage T20 and the third stage T30, and outputs a second scan level in the fourth stage T40. The second scan signal terminal SCAN2 outputs the first scan level in the first stage T10, the second stage T20 and the fourth stage T40, and outputs the second scan level in the third stage T30. The first voltage terminal VDD outputs the first level in the first stage T10, and outputs the second level in the second stage T20, the third stage T30 and the fourth stage T40. The second voltage terminal VSS continuously outputs a low level.

With reference to FIGS. 4 to 6, taking the example where the first switching device T1, the third switching device T3 and the fifth switching device T5 are N-type FETs and the sixth switching device T6 is a P-type FET, the control method of the display device according to an exemplary embodiment may include:

In S401, i.e. the first stage T10: The first scan signal terminal SCAN1 and the second scan signal terminal SCAN2 are controlled to output a first scan level, so that the first switching device T1, the third switching device T3 and the fifth switching device T5 are turned on. The first voltage terminal VDD is controlled to output a first level, so that the sixth switching device T6 is turned on. Data signal terminal is controlled to output the reference level Vref, so that the control electrode of the second switching device T2 is restored to the reference level Vref, the input terminal of the first light emitting device 12 is reset, and the level of the second node B becomes the first level.

In the first stage T10, the ultrasonic transducer 2 emits ultrasonic waves. The first switching device T1, the third switching device T3 and the fifth switching device T5 are all N-type FETs, and the first switching device T1, the third switching device T3 and the fifth switching device T5 are turned on when the control electrodes of the first switching device T1, the third switching device T3 and the fifth switching device T5 receive a higher first scan level. The sixth switching device T6 is a P-type FET, and the sixth switching device T6 is turned on when the control electrode of the sixth switching device T6 receives a lower first level.

In S402, i.e., the second stage T20: the first voltage terminal VDD is controlled to output a second level to turn off the sixth switching device T6; the second switching device T2 is turned off when the level of the signal of the third node D rises to a first preset level; when the control electrode of the fourth switching device T4 receives the echo signal output by the ultrasonic transducer 2 through the second node B, the second electrode of the fourth switching device T4 inputs an amplified signal corresponding to the echo signal, and the amplified signal is sent to a designated part through the fifth switching device T5.

The sixth switching device T6 is a P-type FET, and the sixth switching device T6 is turned off when the control electrode of the sixth switching device T6 receives a higher second level.

In the second stage T20, the ultrasonic transducer 2 receives the reflected ultrasonic waves and generates an echo signal. When the control electrode of the fourth switching device T4 receives the echo signal, the conduction degree of the fourth switching device T4 may be adjusted according to the echo signal, thereby adjusting the current flowing through the fourth switching device T4, which is the amplified signal corresponding to the echo signal. At this time, the fifth switching device T5 is still on, the amplified signal is transmitted to the OUT terminal through the fifth switching device T5, and the designated part is connected to the OUT terminal to receive the amplified signal.

In an exemplary embodiment, the first preset level is Vref−Vth, wherein Vref is the reference level and Vth is the threshold voltage of the second switching device T2.

In the second stage T20, the level of the third node D continues to rise, and when the level of the third node D rises to Vref−Vth, the second switching device T2 is turned off.

In S403, i.e., the third stage T30, the second scan signal terminal SCAN2 is controlled to output the second scan level, so that the first switching device T1 is turned off; the data signal terminal Data is controlled to output data level so that the signal level of the third node D becomes a second preset level.

In an exemplary embodiment, the first switching device T1 is an N-type FET, and when the control electrode of the first switching device T1 receives a lower second scanning level, the first switching device T1 is turned off.

Taking FIG. 3 as an example, the energy storage subcircuit C includes a first capacitor C1 and second capacitor C2 connected in series, with the first terminal of the first capacitor C1 and the second terminal of the second capacitor C2 serving as the first and second terminals of the energy storage subcircuit C, respectively. The second terminal of the first capacitor C1 and the first terminal of the second capacitor C2 are connected in series, and the tandem node of the first capacitor C1 and the second capacitor C2 is used as the common terminal of the energy storage subcircuit C. The capacitance value of the first capacitor C1 is denoted as C1, the capacitance value of the second capacitor C2 is denoted as C2, and the output data level of the data signal terminal Data is denoted as Vdata. At this time, the second preset level is Vref−Vth+(Vdata−Vref) C2/(C1+C2).

In S404, i.e., the fourth stage T40: the first scan signal terminal SCAN1 is controlled to output a second scanning level and the second scan signal terminal SCAN2 is controlled to output a first scanning level, so that the third switching device T3 is turned off and the first switching device T1 is turned on to drive the first light emitting device in the display device to emit light.

In an exemplary embodiment, the third switching device T3 is an N-type FET, and when the control electrode of the third switching device T3 receives a lower second scanning level, the third switching device T3 is turned off.

In the fourth stage T40, the current I of the first light emitting device 12 can be solved by the following formula:

$$I = W*C0*u/(2*L)*((Vdata-vref)C2/(C1+C2))^2$$

In the above formula, W is the channel width of the second switching device T2, C0 is the unit area capacitance of the second switching device T2, u is the carrier mobility of the second switching device T2, L is the channel length of the second switching device T2, C1 is the capacitance value of the first capacitor C1, C2 is the capacitance value of the second capacitor C2, Vdata is the data output level of the data signal terminal Data, and Vref is the reference level.

In an exemplary embodiment, the first pixel circuit 11 may be configured to control the display status of the first light emitting device 12 in the first region, or may be configured to receive the echo signal of the ultrasonic transducer 2 in the display device 100. The first light emitting device 12 and the ultrasonic transducer 2 may share the first pixel circuit 11, which reduces the circuit complexity of the display device and lowers the power consumption of the circuit.

The above control method of the display device is explained by taking the first to fifth switching devices as N-type FETs and the sixth switching device T6 as P-type FET as examples. Those skilled in the art may understand that when the first to fifth switching devices are P-type FETs and the sixth switching device T6 is N-type FET, the driving timing sequence in this case is opposite to that in the above-mentioned control method, and the execution steps in this case can be adaptively adjusted with reference to the above-mentioned control method, which will not be further described here.

The embodiment of the present disclosure also provides a non-transient computer readable storage medium, in which computer-executable instructions are stored, and the computer-program-executable instructions are configured to implement the control method of the display device.

The control methods of the display device are the methods provided in the previous embodiments, and they are similar in the implementation principle and effect, which will not be further described here.

In an exemplary embodiment, the non-transient computer readable storage medium may include, but is not limited to, any type of disk (including floppy disk, hard disk, optical disk, CD-ROM, and magneto-optical disk), ROM, RAM, EPROM (erasable programmable read-only memory), EEPROM, flash memory, magnetic card or optical card. That is, a readable medium includes any medium that stores or transmits information which can be read by a device (e.g., a computer).

The non-transient computer readable storage medium provided by the embodiment of the present disclosure has the same inventive concept and the same beneficial effects as the previous embodiments, and the contents not shown in detail in the display device may be referred to the previous embodiments, and will not be further described in detail here.

Embodiments of the present disclosure may be applied to at least achieve the following beneficial effects:

In the embodiment of the disclosure, because the receiving electrode layer of the ultrasonic transducer is disposed in the display substrate, the thickness of display substrate and the ultrasonic transducer as a whole is reduced the thickness of one receiving electrode layer, and applying the display substrate to the display device can achieve the purpose of reducing the thickness of the display device. The first pixel circuit may be used for the display status of the first light emitting device in the first region, and may alternatively be used for receiving the echo signal of the ultrasonic transducer in the display device, that is to say, the first light emitting device and the ultrasonic transducer can share the first pixel circuit, which can reduce the circuit complexity of the display device and lower the power consumption of the circuit.

Those skilled in the art will understand that acts, measures, solutions in various operations, methods and processes already discussed in the present disclosure may be alternated, changed, combined or deleted. Other acts, measures and schemes in various operations, methods and processes already discussed in the present disclosure may also be alternated, changed, redisposed, divided, combined or deleted.

In addition, the terms "first" and "second" are used for the purpose of description only, and cannot be understood as indication or implication of relative importance or implicit indication of the number of the mentioned technical features. Thus, features defined by "first" and "second" may include one or more of the features explicitly or implicitly. In the description of the present disclosure, unless otherwise specified, "multiple" means two or more.

It may be understood that although each act in the flowcharts of the drawings is shown in the order as indicated by arrows, these acts are not necessarily executed sequentially in the order as indicated by the arrows. Unless explicitly stated herein, the execution of these acts is not strictly limited in order, and may be executed in other orders. Furthermore, at least a part of the acts in the flowcharts of the drawings may include multiple sub-acts or stages, which may not necessarily be completed at the same time, but may be executed at different time, and the execution order may not necessarily be carried out sequentially, but may be executed sequentially or alternately with other acts or at least a part of sub-acts or stages of other acts.

The above is only part of the implementation of the present disclosure, and it should be noted that for those of ordinary skill in the art, without departing from the principles of the present disclosure, several improvements and modifications can be made, and these improvements and modifications should also be regarded as covered by the protection scope of the present disclosure.

What we claim is:

1. A display apparatus, comprising:
a display substrate and an ultrasonic transducer,
wherein the ultrasonic transducer comprises a receiving electrode layer, which is disposed between two opposite bottom surfaces of the display substrate, and other parts of the ultrasonic transducer are disposed outside the display substrate; and
the display substrate is provided with a first pixel circuit and a first light emitting device, the first light emitting device and the receiving electrode layer are respectively connected with corresponding output terminals of the first pixel circuit;
wherein the first pixel circuit comprises an energy storage subcircuit and first to sixth switching devices;
a first electrode, a second electrode and a control electrode of the first switching device are electrically connected to a first voltage terminal, a first electrode of the second switching device and a second scan signal terminal, respectively;
a control electrode and a second electrode of the second switching device are electrically connected to a first node and a third node, respectively;
a first electrode, a second electrode and a control electrode of the third switching device are electrically connected to a data signal terminal, the first node and a first scan signal terminal, respectively;
a first electrode, a second electrode and a control electrode of the fourth switching device are electrically connected to the first voltage terminal and a first electrode of the fifth switching device and a second node, respectively;
a control electrode and a second electrode of the fifth switching device are electrically connected to the first scan signal terminal and an echo signal output terminal, respectively;
a first electrode and a control electrode of the sixth switching device are both electrically connected to the first voltage terminal, and the second electrode of the sixth switching device is electrically connected to the second node;
a first terminal, a second terminal and a common terminal of the energy storage subcircuit are electrically connected to the first node, a second voltage terminal and the third node, respectively.

2. The display apparatus of claim 1, wherein the two opposite bottom surfaces of the display substrate comprise a shady surface and a light exiting surface; the receiving electrode layer is close to the shady surface, and other parts of the ultrasonic transducer are attached to one side, away from the light exiting surface, of the shady surface.

3. The display apparatus of claim 2, wherein the other parts of the ultrasonic transducer comprise a piezoelectric material layer and a transmitting electrode layer;
the piezoelectric material layer is attached to one side, away from the light exiting surface, of the shady surface, and the transmitting electrode layer is attached to one side, away from the shady surface, of the piezoelectric material layer.

4. The display apparatus of claim 1, wherein the second node is electrically connected to the receiving electrode layer of the ultrasonic transducer.

5. The display apparatus of claim 1, wherein a first electrode and a second electrode of the first light emitting device are electrically connected to the third node and the second voltage terminal, respectively.

6. The display apparatus of claim 1, wherein the first to fifth switching devices are N-type field-effect transistors (FETs), and the control electrode, the first electrode and the second electrode of each switching device in the first to fifth switching devices are a gate electrode, a source electrode and a drain electrode of the N-type FETs, respectively;
the second switching device is a driving transistor.

7. The display apparatus of claim 6, wherein the sixth switching device is a P-type FET, and a control electrode, a first electrode and a second electrode of the sixth switching device are a gate electrode, a source electrode and a drain electrode of the P-type FET, respectively.

8. The display apparatus of claim 1, wherein the first to fifth switching devices are P-type FETs, and the control electrode, the first electrode and the second electrode of each switching device in the first to fifth switching devices are a gate electrode, a source electrode and a drain electrode of the P-type FETs, respectively;

the second switching device is a driving transistor.

9. The display apparatus of claim 8, wherein the sixth switching device is an N-type FET, and a control electrode, a first electrode and a second electrode of the sixth switching device are a gate electrode, a source electrode and a drain electrode of the N-type FET, respectively.

10. The display apparatus of claim 1, wherein the energy storage subcircuit comprises at least two capacitors connected in series;
a first terminal of a first capacitor and a second terminal of a last capacitor are respectively used as a first terminal and a second terminal of the energy storage subcircuit; a tandem node of two specified capacitors is used as a common terminal of the energy storage subcircuit.

11. The display apparatus of claim 1, wherein the energy storage subcircuit comprises a first capacitor and a second capacitor;
a first terminal and a second terminal of the first capacitor are electrically connected to the first node and the third node respectively;
a first terminal and a second terminal of the second capacitor are electrically connected to the third node and the second voltage terminal respectively;
the first terminal of the first capacitor serves as a first terminal of the energy storage subcircuit, the second terminal of the second capacitor serves as a second terminal of the energy storage subcircuit, and the third node serves as a common terminal of the energy storage subcircuit.

12. A display device, comprising the display apparatus of claim 1.

13. The display device of claim 12, further comprising a processor;
the processor is electrically connected to a signal input terminal of the first pixel circuit in the display apparatus and is configured to control the first pixel circuit to drive the first light emitting device in the display apparatus to emit light, or receive a signal of the ultrasonic transducer in the display apparatus.

14. The display device of claim 13, further comprising a flexible printed circuit board;
a first terminal of the flexible printed circuit board is electrically connected to the display substrate, and a second terminal is bent to a non-display side of the display substrate;
the processor is disposed at the second terminal of the flexible printed circuit board and located on a side, away from the display substrate, of the second terminal of the flexible printed circuit board, and is electrically connected to the signal input terminal of the first pixel circuit through the flexible printed circuit board.

15. A control method of the display device, applied to the display device of claim 12, comprising:
controlling the first pixel circuit to drive the first light emitting device in the display apparatus to emit light, or receive an echo signal of the ultrasonic transducer in the display apparatus.

16. The control method of claim 15, wherein controlling the first pixel circuit to drive the first light emitting device in the display apparatus to emit light, or receive the echo signal of the ultrasonic transducer in the display apparatus comprises:
controlling a first scan signal terminal and a second scan signal terminal to output a first scan level to enable a first switching device, a third switching device and a fifth switching device to be turned on; controlling a first voltage terminal to output a first level to enable a sixth switching device to be turned on; controlling a data signal terminal to output a reference level to enable a control electrode of a second switching device to be restored to the reference level, an input terminal of the first light emitting device to be reset, and a level of a second node to become the first level; the ultrasonic transducer emits ultrasonic waves;
controlling the first voltage terminal to output a second level to turn off the sixth switching device; when a level of the signal of a third node rises to a first preset level, the second switching device is turned off; when a control electrode of a fourth switching device receives the echo signal output by the ultrasonic transducer through the second node, a second electrode of the fourth switching device inputs an amplified signal corresponding to the echo signal, and the amplified signal is sent to a designated part through the fifth switching device;
controlling the second scan signal terminal to output a second scanning level to turn off the first switching device; controlling the data signal terminal to output a data level to enable a level of the third node to become a second preset level;
controlling the first scan signal terminal to output a second scanning level and controlling the second scan signal terminal to output a first scanning level, to enable the third switching device to be turned off and the first switching device to be turned on to drive the first light emitting device in the display apparatus to emit light.

17. The control method of claim 16, wherein the first preset level is a difference between the reference level and a threshold voltage of the second switching device.

18. The control method of claim 16, wherein the first pixel circuit comprises: the first to sixth switching devices, a first capacitor and a second capacitor, and the second preset level V meets $$V=V\text{ref}-V\text{th}+(V\text{data}-V\text{ref})C2/(C1+C2)$$

wherein Vref is the reference level, Vdata is the data level, Vth is the threshold voltage of the second switching device, C1 is a capacitance value of the first capacitor, and C2 is a capacitance value of the second capacitor.

19. A non-transient computer readable storage medium, in which computer executable instructions are stored, wherein the computer executable instructions enable a computer to implement the control method of the display device of claim 15.

* * * * *